United States Patent
Nakagawa

(10) Patent No.: US 6,355,525 B1
(45) Date of Patent: Mar. 12, 2002

(54) METHOD OF PRODUCING NON-VOLATILE SEMICONDUCTOR MEMORY DEVICE HAVING A FLOATING GATE WITH PROTRUDING CONDUCTIVE SIDE-WALL PORTIONS

(75) Inventor: Shinichi Nakagawa, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/714,519

(22) Filed: Nov. 17, 2000

Related U.S. Application Data

(62) Division of application No. 09/302,398, filed on Apr. 30, 1999, now Pat. No. 6,172,394.

(30) Foreign Application Priority Data

Nov. 5, 1998 (JP) .......................... 10-314458

(51) Int. Cl.[7] ........................... H01L 21/336
(52) U.S. Cl. .................. 438/257; 438/301; 438/304
(58) Field of Search .................. 438/257, 267, 438/283, 301, 304, 201, 211, 230

(56) References Cited

U.S. PATENT DOCUMENTS

| | | | | |
|---|---|---|---|---|
| 5,413,949 A | * | 5/1995 | Hong .......................... | 438/290 |
| 5,476,801 A | * | 12/1995 | Keshtbod ...................... | 438/264 |
| 5,646,059 A | | 7/1997 | Cheu et al. .................. | 438/257 |
| 5,679,968 A | | 10/1997 | Smayling et al. ........... | 257/213 |
| 5,920,094 A | | 7/1999 | Nam .......................... | 257/347 |
| 5,977,601 A | | 11/1999 | Yang et al. ................. | 257/437 |
| 5,981,993 A | | 11/1999 | Cho .......................... | 257/311 |
| 6,153,469 A | * | 11/2000 | Yun et al. ................... | 438/257 |
| 6,187,636 B1 | * | 2/2001 | Jeong ......................... | 438/267 |
| 6,204,122 B1 | * | 3/2001 | Joo et al. .................... | 438/257 |
| 6,261,903 B1 | * | 7/2001 | Chang et al. ................ | 438/257 |

OTHER PUBLICATIONS

Kitamura et al., "A Low Voltage Operating Flash Memory Cell with High Coupling Ratio Using Horned Floating Gate with Fine HSG", IEEE Symposium on VLSI Technology Digest of Technical Papers, Jun. 9–11, 1998, pp. 104–105.*

* cited by examiner

Primary Examiner—Matthew Smith
Assistant Examiner—Lex H. Malsawma
(74) Attorney, Agent, or Firm—Armstrong, Westerman & Hattori, LLP

(57) ABSTRACT

A non-volatile semiconductor memory device includes memory cells each having a duplicate gate structure in which a floating gate and a control gate are stacked. Each memory cell includes a semiconductor substrate of a first conductivity type; a first gate insulation film formed on the semiconductor substrate; a first conductive film formed on the first gate insulation film and constituting a portion of the floating gate; first and second semiconductor regions of a second conductivity type opposite to the first conductivity type, formed on the semiconductor substrate so as to be self-aligned with side walls of the first conductive film; conductive side-wall portions formed additionally formed on the side walls so as to protrude from a top surface of the first conductive film and to overlap the first and second semiconductor regions, and constituting the remaining portion of the floating gate; a second gate insulation film formed to cover the first conductive film and the conductive side-wall portions; and a second conductive film formed on the second gate insulation film and constituting the control gate. This structure can improve the write efficiency and the erasure efficiency, and reduce the cell area and voltages to be applied to each cell in the write operation and the erasure operation.

12 Claims, 9 Drawing Sheets

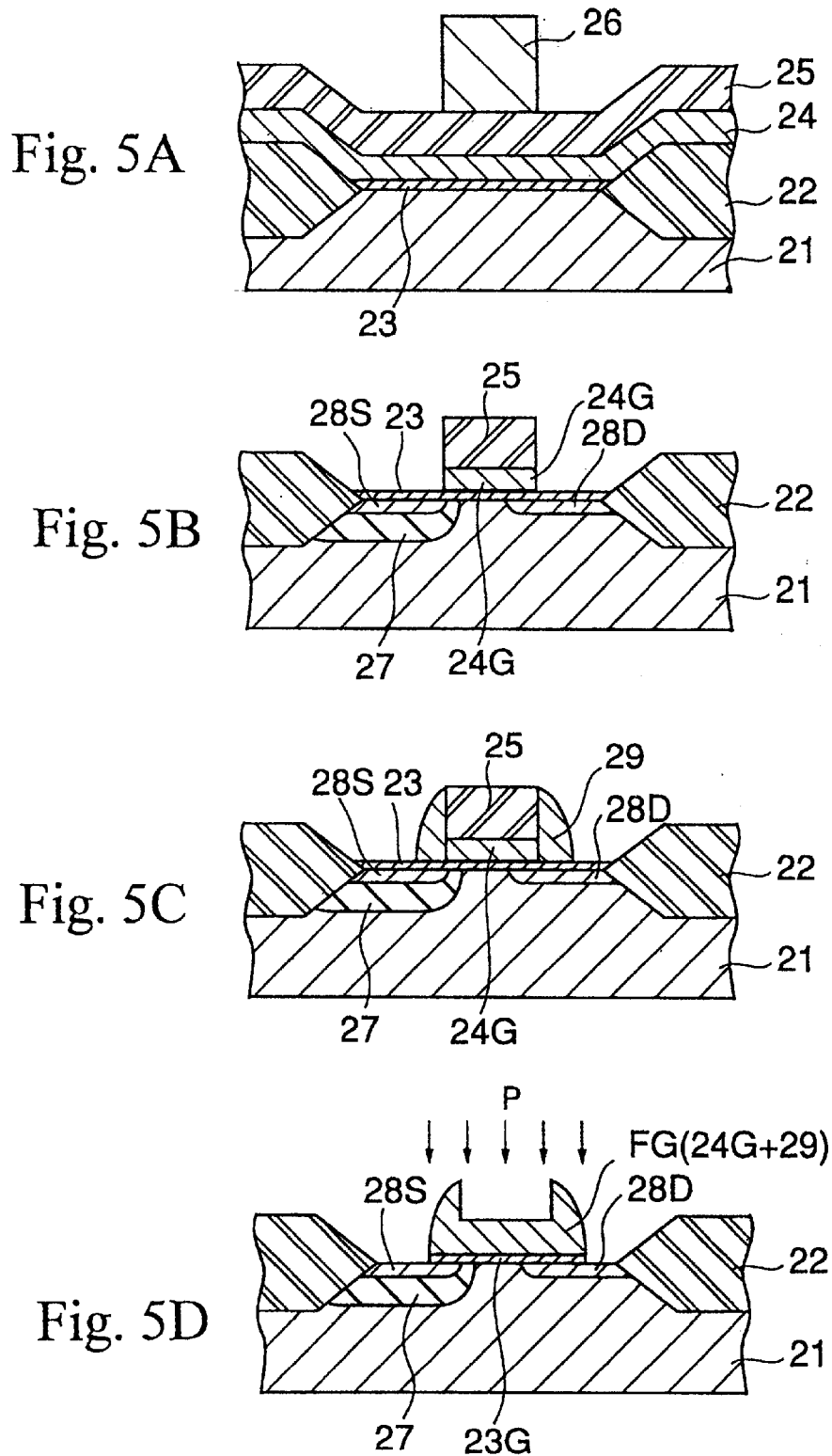

METHOD OF PRODUCING NON-VOLATILE SEMICONDUCTOR MEMORY DEVICE HAVING A FLOATING GATE WITH PROTRUDING CONDUCTIVE SIDE-WALL PORTIONS

This application is a divisional of prior application Ser. No. 09/302,398 filed Apr. 30, 1999 now U.S. Pat. No. 6,172,394.

BACKGROUND OF THE INVENTION

1. Field of the Invention

The present invention relates to a semiconductor memory device. More particularly, it relates to a non-volatile semiconductor memory device including memory cells each having a duplicate gate structure in which a floating gate and a control gate are stacked, such as an EPROM, an EEPROM or a flash memory, and to a method of producing the same.

2. Description of the Prior Art

FIGS. 1A through 1D schematically illustrating steps of producing a memory cell in a flash memory according to prior art.

At the first step (see FIG. 1A), an oxide film as an insulation film 2 for device isolation is deposited about 400 nm to 800 nm thick on a semiconductor substrate (e.g., a p-type silicon substrate) 1 by, for example, thermal oxidation, and an oxide film 3 to be a first gate insulation film is further deposited about 10 nm thick by thermal oxidation. Then, a polysilicon film 4 to be a floating gate is formed approximately 130 nm thick on the entire surface of the resultant structure, and phosphorus (P) or the like as an impurity is doped into the polysilicon film 4. Then, an oxide film 5 to be a second gate insulation film is deposited about 20 nm thick by thermal oxidation after which a polysilicon film 6 to be a control gate is formed approximately 150 nm thick on the entire surface of the resultant structure, and phosphorus (P) or the like as an impurity is doped into the polysilicon film 6.

At the next step (see FIG. 1B), resist patterning (coating a resist on) of the control gate is carried out by using photolithography, and the polysilicon film 6, the oxide film 5, the polysilicon film 4 and the oxide film 3 are etched with the resist used as a mask. Then, the resist is removed. This completes a lamination structure in which the first gate insulation film 3G, floating gate 4G, the second gate insulation film 5G and the control gate 6G are stacked in order on the semiconductor substrate 1 as illustrated.

At the subsequent step (see FIG. 1C), to make a source region of a high withstand voltage, as an impurity, phosphorus (P) or the like whose conductivity type is opposite to that of the semiconductor substrate 1 is lightly doped using photolithography, thereby forming an n-type diffusion layer 7, and as another impurity, arsenic (As) or the like whose conductivity type is opposite to that of the semiconductor substrate 1 is heavily doped by photolithography, thereby forming an n-type diffusion layer (source region) 8S and an n-type diffusion layer (drain region) 8D. Next, an oxide film as an insulation film is grown about 200 nm thick on the entire surface of the resultant structure by chemical vapor deposition (CVD), then anisotropic dry etching is performed to form a side-wall insulation film 9 on the side walls of the lamination structure (3G, 4G, 5G and 6G).

At the final step (see FIG. 1D), after an interlayer insulation film LS is formed by CVD, contact holes which respectively reach the source region 8S, the drain region 8D and the control gate 6G are formed, and electrode wires WS, WD and WG are so formed as to fill the individual contact holes. This completes the memory cell structure.

The write operation (programming) and erasing operation of a non-volatile semiconductor memory device which has memory cells that are fabricated in the above-described manner are implemented as follows. In the write mode, a voltage is applied between the control gate and the drain region in such a way as to generate a positive electric field therebetween. This causes hot electrons to be generated from the drain region. The electrons are injected into the floating gate to write information. In the erasure mode, a voltage is applied between the control gate and the source region in such a way as to generate a negative electric field therebetween, and electrons are drained into the source region from the floating gate through the oxide film (first gate insulation film) by the F-N (Fowler-Nordheim) tunnel current, thereby erasing information.

Since the write operation and erasing operation of a non-volatile semiconductor memory device are executed respectively by injection of electrons into the floating gate and draining of electrons from the floating gate, as mentioned above, their operation characteristics are influenced by the voltage that is applied to the floating gate. The floating gate voltage that affects the operation characteristics will now be described with reference to FIG. 2 which shows the conceptual structure of a memory cell having a duplicate gate structure.

As shown in FIG. 2, assuming that the capacitance between the floating gate and the substrate is C1; the capacitance between the floating gate and the control gate is C2; the capacitance between the floating gate and the drain region is C3; the capacitance between the floating gate and the source region is C4; the drain voltage is $V_D$; the source voltage is $V_S$; the control gate voltage is $V_{CG}$; the floating gate voltage is $V_{FG}$; the area of the overlapping portion of the floating gate over the source region is S; an electric field which is applied to the oxide film (first gate insulation film) between the floating gate and the source region in the erasure mode is $E_{OX}$; and the F-N tunnel current which flows into the source region from the floating gate in the erasure mode is $I_{FN}$, the floating gate voltage in the write mode and the floating gate voltage and the F-N tunnel current $I_{FN}$ in the erasure mode are respectively expressed by following equations (1), (2) and (3).

$$V_{FG(W)} = \{C2/(C1+C2+C3+C4)\}V_{CG} + \{C3/(C1+C2+C3+C4)\}V_D \quad (1)$$

$$V_{FG(E)} = \{C2/(C1+C2+C3+C4)\}V_{CG} + \{C4/(C1+C2+C3+C4)\}V_S \quad (2)$$

$$I_{FN} = A_{FN} \, S \, E_{OX}^2 \, \exp(B_{FN}/E_{OX}) \quad (3)$$

where $A_{FN}$ and $B_{FN}$ are constants.

Assuming that the control gate voltage $V_{CG}$ and the drain voltage $V_D$ are constant, the equation (1) shows that the floating gate voltage $V_{FG(W)}$ in the write mode becomes higher as the capacitances C2 and C3 get larger. The higher this floating gate voltage $V_{FG(W)}$ gets, the greater the amount of electrons to be injected into the floating gate becomes, so that the write time can be shortened. It is therefore preferable that the floating gate voltage $V_{FG(W)}$ is high. This requires that the capacitances C2 and C3 should be made large.

Likewise, assuming that the control gate voltage $V_{CG}$ and the source voltage $V_S$ are constant, it is apparent from the equation (2) that the floating gate voltage $V_{FG(E)}$ in the erasure mode becomes higher as the capacitance C2 gets greater. The higher this floating gate voltage $V_{FG(E)}$ gets, the greater the amount of electrons to be drained from the floating gate becomes, allowing the erasure time to be shortened. It is therefore preferable that the floating gate voltage $V_{FG(E)}$ is high. This requires that the capacitance C2 should be made large.

Also, assuming that the electric field $E_{OX}$ to be applied to the first gate insulation film is constant, it is apparent from the equation (3) that the larger the area S of the overlapping portion of the floating gate over the source region gets, the greater the F-N tunnel current $I_{FN}$ becomes, thereby permitting the erasure time to be shortened. It is thus preferable that the overlapping area S is large.

It should be understood from FIG. 2 that the capacitance C2 is proportional to the size of the opposing area of the floating gate to the control gate and is inversely proportional to the thickness of the second gate insulation film. The capacitance C3 is proportional to the area of the floating gate that overlaps the drain region and is inversely proportional to the thickness of the first gate insulation film. The F-N tunnel current $I_{FN}$ is proportional to the area (S) of the floating gate that overlaps the source region.

To increase the capacitances C2 and C3 and the F-N tunnel current $I_{FN}$, therefore, it is necessary to make the individual gate insulation films thinner or to increase the area of the floating gate overlapping the drain/source region or the opposing area of the floating gate with respect to the control gate. In this case, since there is a limit to making the individual gate insulation films thinner from the viewpoint of securing the insulation property, an approach to increase the area of the floating gate that overlaps the drain/source region is rather effective.

According to the above prior art (see FIGS. 1A to 1D), since the side-wall insulation film 9 is formed on the side walls of the floating gate 4G, the area of the floating gate 4G that overlaps the source region 8S and the drain region 8D, which are formed on the semiconductor substrate 1 so as to be self-aligned with the floating gate 4G, is not large enough. That is, the size of the capacitance C3 and the area S of the overlapping portion of the floating gate over the source region are not sufficiently large, but are rather small.

When the capacitances C2 and C3 are small, it is apparent from the equation (1) that the floating gate voltage $V_{FG(W)}$ in the write mode decreases relatively with respect to the same voltages $V_{CG}$ and $V_D$. As a result, the efficiency of electron injection into the floating gate (i.e., the writing efficiency) decreases, undesirably making the write time longer.

When the capacitance C2 is small and the area (S) of the overlapping portion of the floating gate over the source region is not large enough, it is apparent from the equations (2) and (3) that the floating gate voltage $V_{FG(E)}$ in the erasure mode is lowered relatively with respect to the same voltages $V_{CG}$ and $V_S$. So does the F-N tunnel current $I_{FN}$. Consequently, the efficiency of draining electrons from the floating gate into the source region by the F-N tunnel current $I_{FN}$ (i.e., the erasing efficiency) gets lower, undesirably making the erasure time longer.

Also, according to the above prior art, increasing the capacitance C2 between the floating gate and the control gate requires that the opposing areas of both gates should be made larger. This results in an increase in the area of each memory cell and eventually leads to a reduction in the integration scale. Thus, some improvement should be made on that approach.

Further, because the capacitances C2 and C3 and the area (S) of the floating gate that overlaps the source region are insufficient, increasing the floating gate voltages $V_{FG(W)}$ and $V_{FG(E)}$ to improve the write efficiency and erasure efficiency requires that the individual voltages $V_{CG}$, $V_D$ and $V_S$ to be applied to each memory cell should be increased. This undesirably results in an increase in the power consumption of a non-volatile semiconductor memory device.

SUMMARY OF THE INVENTION

An object of the present invention is to provide a non-volatile semiconductor memory device which can improve write and erasure efficiencies and can reduce the cell area and voltages to be applied to each cell in the write and erasure operations, and a method of producing the same.

According to one aspect of the present invention, there is provided a non-volatile semiconductor memory device as shown in FIG. 3 as its fundamental constitution. The device includes memory cells 10 each having a duplicate gate structure in which a floating gate FG and a control gate CG are stacked. Each memory cell 10 comprises a semiconductor substrate 11 of a first conductivity type; a first gate insulation film 12 formed on the semiconductor substrate 11; a first conductive film 13 formed on the first gate insulation film 12 and constituting a portion of the floating gate FG; first and second semiconductor regions 14 and 15 of a second conductivity type opposite to the first conductivity type, formed on the semiconductor substrate 11 so as to be self-aligned with side walls of the first conductive film 13; conductive side-wall portions 16 formed additionally formed on the side walls so as to protrude from a top surface of the first conductive film 13 and to overlap the first and second semiconductor regions 14 and 15, and constituting the remaining portion of the floating gate FG; a second gate insulation film 17 formed to cover the first conductive film 13 and the conductive side-wall portions 16; and a second conductive film 18 formed on the second gate insulation film 17 and constituting the control gate CG.

According to the structure of the memory cell 10 embodying the present invention, steps which depend on the shapes of the conductive side-wall portions 16 are formed between the floating gate FG (the first conductive film 13 and conductive side-wall portions 16) and the control gate CG (the second conductive film 18) and thus, the opposing area of the floating gate FG to the control gate CG increases relatively and the capacitance of this portion (the capacitance C2 in FIG. 2) increases accordingly. Also, since the conductive side-wall portions 16 which serve as an additional floating gate are provided on the side walls of the actual floating gate portion (the first conductive film 13), the areas S1 and S2 of the floating gate FG that overlap the first and second semiconductor regions 14 and 15 which are formed on the semiconductor substrate 11 so as to be self-aligned with the side walls of the first conductive film 13 increase relatively, and the capacitance of this portion (the capacitance C3 in FIG. 2) also increases accordingly.

Therefore, as is understood from the equation (1), the increases in the capacitances C2 and C3 increase the effective voltage $V_{FG(W)}$ that is applied to the floating gate FG in the write mode with respect to the same voltages $V_{CG}$ and $V_D$, resulting in an increased amount of electrons to be injected into the floating gate (improvement on the write efficiency). Accordingly, the write time is shortened, thus improving the write characteristic of the memory cell.

Also, as is understood from the equations (2) and (3), the increase in the capacitance C2 and the increase in the area S2 (indicated by "S" in FIG. 2) of the overlapping portion of the floating gate FG over the source region (the first semiconductor region 14) increase the effective voltage $V_{FG(E)}$ that is applied to the floating gate FG in the erasure mode with respect to the same voltages $V_{CG}$ and $V_S$ and increase the F-N tunnel current $I_{FN}$. This results in an increase in the amount of electrons to be drained into the source region, (the first semiconductor region 14) from the floating gate (improvement on the erasure efficiency). Accordingly, the erasure time is shortened, thus improving the erasure characteristic of the memory cell.

Also, according to the structure of the memory cell 10 embodying the present invention, by employing a specific cross-sectional shape for the floating gate FG (concave shape in the example in FIG. 3), the capacitance C2 of the opposing area of the floating gate FG to the control gate CG can be increased by relatively increasing this opposing area without increasing the cell area. In other words, the area of each memory cell can be reduced with respect to the same capacitance C2.

Further, increasing the capacitances C2 and C3 can increase the floating gate voltage $V_{FG(W)}$ in the write mode with respect to the same voltages $V_{CG}$ and $V_D$ and increase the floating gate voltage $V_{FG(E)}$ in the erasure mode with respect to the same voltages $V_{CG}$ and $V_S$. That is, the voltages ($V_{CG}$, $V_D$, $V_S$) to be applied to the individual portions of each memory cell can be reduced with respect to the same floating gate voltage $V_{FG(W)}$ or $V_{FG(E)}$.

Also, according to another aspect of the present invention, there is provided a method of producing a non-volatile semiconductor memory device, the method including a step of forming memory cells each having a duplicate gate structure in which a floating gate and a control gate are stacked, the step of forming memory cells comprising: a first step of forming a first gate insulation film, a first conductive film and an insulation film in due order on a semiconductor substrate of a first conductivity type; a second step of forming first and second semiconductor regions of a second conductivity type opposite to the first conductivity type on the semiconductor substrate so as to be self-aligned with side walls of the first conductive film; a third step of forming conductive side-wall portions on the side walls of the first conductive film and side walls of the insulation film; a fourth step of removing the insulation film; a fifth step of doping an impurity into the first conductive film and the conductive side-wall portions to thereby form the floating gate; a sixth step of forming a second gate insulation film and a second conductive film in due order so as to cover the floating gate; a seventh step of, after doping an impurity in the second conductive film, forming a mask of a shape matching a shape of a resultant floating gate on the second conductive film; and an eighth step of removing the second conductive film, the second gate insulation film, the conductive side-wall portions and the first gate insulation film along the mask, to thereby form the resultant floating gate and the control gate.

BRIEF DESCRIPTION OF THE DRAWINGS

FIGS. 5A to 5H are cross-sectional views illustrating steps of producing a memory cell according to the first embodiment;

DETAILED DESCRIPTION OF THE PREFERRED EMBODIMENTS

Preferred embodiments of the present invention will be explained hereinafter in detail with reference to the FIGS. 4 to 10.

Figure 4:
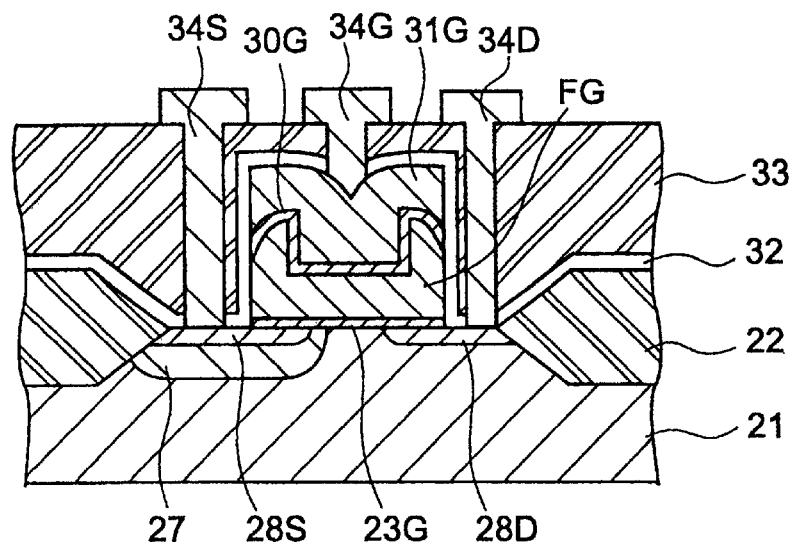
FIG. 4 is a cross-sectional view schematically showing the structure of a memory cell in a flash memory according to a first embodiment of the present invention.

FIG. 4 schematically shows the structure of a memory cell in a flash memory according to the first embodiment of the present invention in a cross-sectional view.

Referring to FIG. 4, "21" denotes a semiconductor substrate, "22" denotes an insulation film for device isolation, "23G" denotes a first gate insulation film, "27" denotes a lightly-doped diffusion layer for making a source region have a high withstand voltage, "28S" denotes a heavily-doped diffusion layer which constitutes the source region, "28D" denotes a heavily-doped diffusion layer which constitutes a drain region, "FG" denotes a floating gate having a generally concave shape, "30G" denotes a second gate insulation film, "31G" denotes a control gate, "32" denotes an oxide film, "33" denotes an interlayer insulation film, "34S" denotes an electrode wire which is in contact with the source region 28S, "34D" denotes an electrode wire which is in contact with the drain region 28D, and "34G" is an electrode wire which is in contact with the control gate 31G.

The structural feature of the memory cell according to the first embodiment lies in that the floating gate FG has portions protruding upward on both end portions (the protruding portions hereinafter called "side-wall portions"), steps with shapes according to the shapes of the side-wall portions are formed on the surface of the floating gate FG, and the individual side-wall portions respectively overlap the source region 28S and the drain region 28D.

Next, the method of producing the memory cell according to the first embodiment will be described with reference to FIGS. 5A to 5H.

At the first step (see FIG. 5A), by using thermal oxidation or CVD, an oxide film as the insulation film 22 for device isolation is deposited about 400 nm to 800 nm thick on the semiconductor substrate 21 of a first conductivity type (p-type silicon substrate in the present embodiment) and an oxide film 23 to be the first gate insulation film 23G is further deposited about 10 nm thick. Then, a polysilicon film 24 to be a part of the floating gate FG is formed, for example, approximately 130 nm thick on the entire surface of the resultant structure, and a silicon oxide film ($SiO_2$) or a silicon nitride film ($Si_3N_4$) as an insulation film 25 is deposited about 150 nm thick on the polysilicon film 24. Then, resist patterning with respect to the insulation film 25 and the polysilicon film 24 (coating of a resist 26) is executed by using photolithography. With the resist 26 used as a mask, the insulation film 25 and the polysilicon film 24 are etched, and then the resist 26 is removed. The polysilicon film 24 after the etching constitutes a portion 24G (see FIG. 5B) of the floating gate FG.

At the next step (see FIG. 5B), three semiconductor regions 27, 28S and 28D of a second conductivity type (n-type) opposite to the first conductivity type are formed on the semiconductor substrate 21 so as to be self-aligned with the side walls of the polysilicon film 24G by using photolithography. Specifically, an n-type impurity such as phosphorus (P) is lightly doped in one of the side walls at a small dose and relatively large acceleration energy, thereby forming a lightly-doped diffusion layer 27, and then an n-type impurity such as arsenic (As) is heavily doped in both side walls at a large dose and relatively small acceleration energy, thereby forming heavily-doped diffusion layers 28S and 28D. Those heavily-doped diffusion layers 28S and 28D respectively constitute the source region and the drain region, while the lightly-doped diffusion layer 27 is provided to allow the source region 28S to have a high withstand voltage.

At the subsequent step (see FIG. 5C), after a polysilicon film with a thickness ranging from 100 nm to 300 nm (about 150 nm to 200 nm in the present embodiment) is formed on the entire surface of the resultant structure, anisotropic dry etching is performed on this polysilicon film to form polysilicon side-wall portions 29 on the side walls of the polysilicon film 24G and the insulation film 25. The polysilicon side-wall portions 29 constitute the remaining portion of the floating gate FG.

At the subsequent step (see FIG. 5D), after the insulation film 25 is removed by wet etching, phosphorus (P) or the like as an impurity is doped into the polysilicon film 24G and the polysilicon side-wall portions 29. The impurity-doped polysilicon film 24G and polysilicon side-wall portions 29 together constitute the floating gate FG.

At the next step (see FIG. 5E), an oxide film 30 to be the second gate insulation film 30G is formed about 20 nm thick so as to cover the floating gate FG by thermal oxidation or CVD at a temperature of, for example, 950° C. or below. This oxide film 30 may be replaced by a laminated film having oxide films and nitride films formed alternately one on another.

At the subsequent step (see FIG. 5F), a polysilicon film 31 to be the control gate 31G is formed about 150 nm thick on the entire surface of the resultant structure, and phosphorus (P) or the like as an impurity is doped into this polysilicon film 31. Then, resist patterning (coating of the resist 32) according to the shape of the resultant floating gate FG is implemented by using photolithography. It should be noted that the polysilicon film 31 may be replaced by a lamination structure in which a polysilicon film and a metal film or a metal reaction film are laminated one on the other.

At the next step (see FIG. 5G), with the resist 32 coated in the previous step as a mask, the polysilicon film 31, the oxide film 30, the polysilicon side-wall portions (both end portions of the floating gate FG) and the first gate insulation film 23G are etched, and then the resist 32 is removed. This completes the resultant duplicate gate structure of the memory cell, in which the control gate 31G is stacked via the second gate insulation film 30G on the floating gate FG with a concave shape that is formed on the first gate insulation film 23G.

At the final step (see FIG. 5H), the oxide film 32 is grown to a thickness of 200 nm by CVD, and the interlayer insulation film 33 is further formed on the oxide film 32, and contact holes which respectively reach the source region 28S, the drain region 28D and the control gate 31G are formed. Then, the electrode wires 34S, 34D and 34G of, for example, aluminum (Al) are formed to fill the respective contact holes, thereby completing the intended cell structure of the flash memory according to the first embodiment.

Figure 1A:
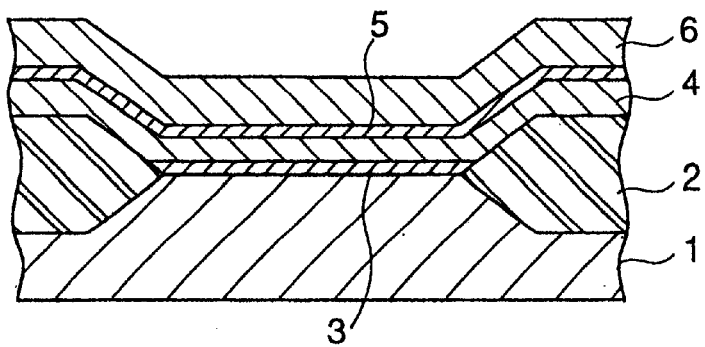
FIGS. 1A to 1D are cross-sectional views illustrating steps of producing a memory cell in a flash memory according to the prior art.
Figure 1B:
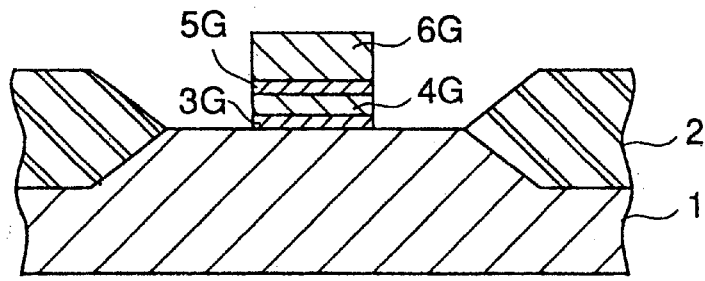
Figure 1C:
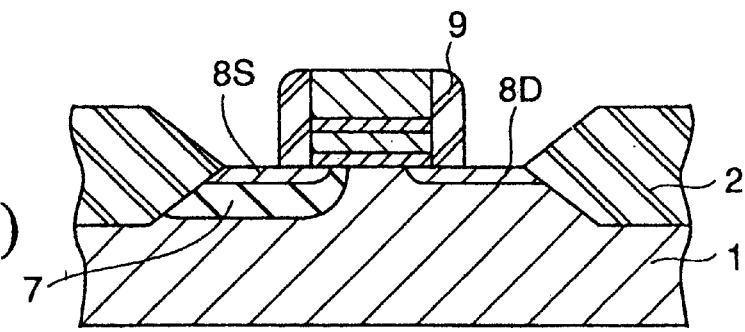
Figure 1D:
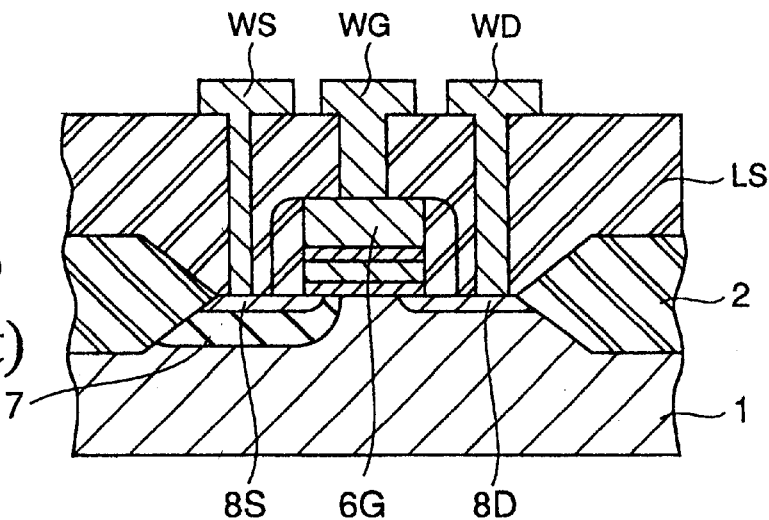
Figure 2:
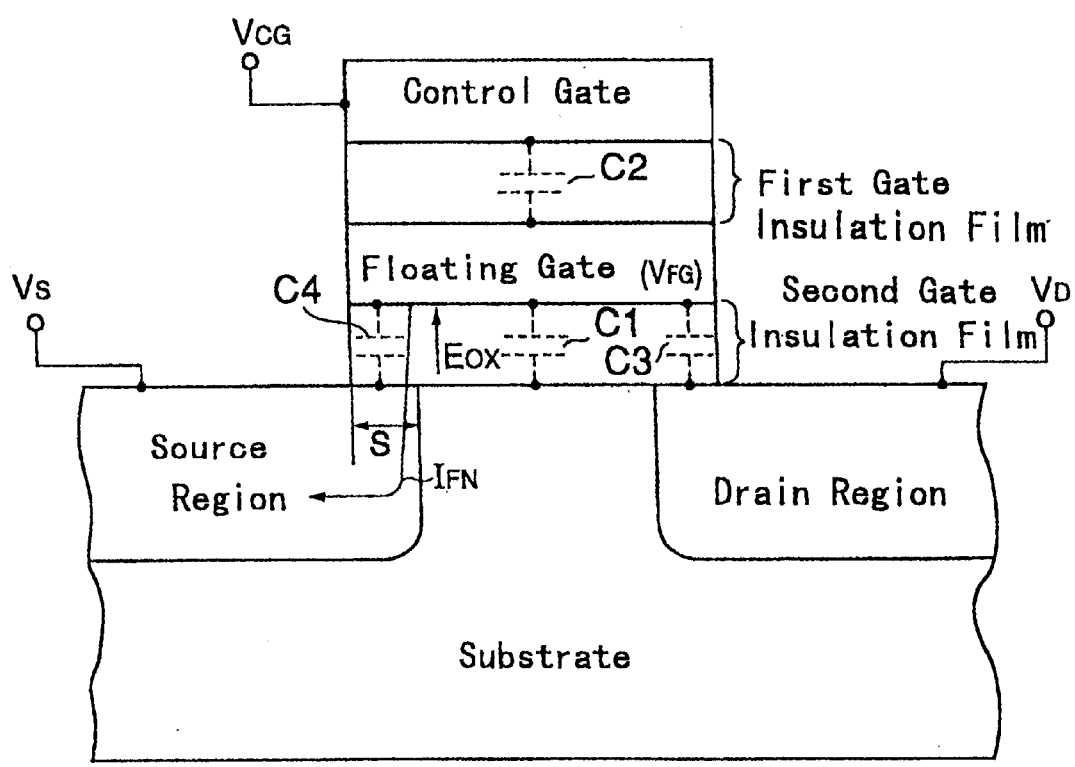
FIG. 2 is a diagram showing the conceptual structure of a memory cell having a duplicate gate structure.
Figure 3:
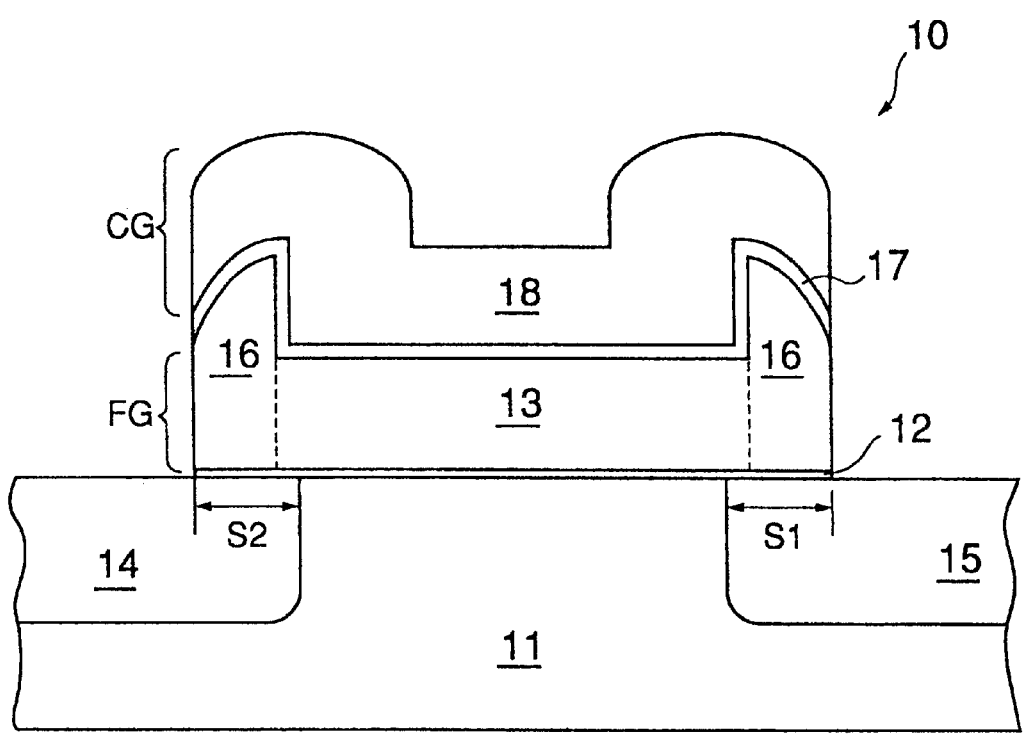
FIG. 3 is a diagram for explaining the principle of the non-volatile semiconductor memory device according to the present invention.

As described above, according to the first embodiment, steps which depend on the shapes of the polysilicon sidewall portions 29 are formed on the surface of the floating gate FG (the polysilicon film 24G and polysilicon side-wall portions 29), and thus the opposing area of the floating gate FG to the control gate 31G increases relatively and the capacitance between both gates (the capacitance C2 in FIG. 2) also increases accordingly. Since the polysilicon side-wall portions 29 at both end portions of the floating gate FG are provided to respectively overlap the source region 28S and the drain region 28D, the areas of the floating gate FG that overlap the source/drain regions increase by the; areas of the polysilicon side-wall portions 29. Accordingly, the capacitance between the floating gate FG and the drain region (the capacitance C3 in FIG. 2) increases accordingly.

As is understood from the equations (1), (2) and (3), the increases in the capacitances C2 and C3 and the increase in the overlapping portion (indicated by "S" FIG. 2) cause the floating gate voltage $V_{FG(W)}$ to increase in the write mode, increasing the amount of electrons to be injected into the floating gate (improvement on the write efficiency). This shortens the write time. In the erasure mode, the floating gate voltage $V_{FG(E)}$ increases and the F-N tunnel current $I_{FN}$ increases, thus increasing the amount of electrons to be drained into the source region from the floating gate (improvement on the erasure efficiency). This shortens the erasure time.

According to the structure of the memory cell of the present embodiment, by designing the cross-sectional shape of the floating gate FG in a concave shape, the capacitance C2 between the floating gate FG and the control gate 31G can be increased without increasing the cell area. In other words, the area of each memory cell can be reduced with respect to the same capacitance C2. This contributes to an improvement in the integration scale of the individual memory cells of the flash memory as a whole.

Further, the increases in the capacitances C2 and C3 can increase the floating gate voltage $V_{FG(W)}$ in the write mode and the floating gate voltage $V_{FG(E)}$ in the erasure mode with respect to the same control gate voltage $V_{CG}$, drain voltage $V_D$ and source voltage $V_S$. Namely, the voltages ($V_{CG}$, $V_D$, $V_S$) to be applied to the individual portions of each memory cell can be reduced with respect to the same floating gate voltage $V_{FG(W)}$ or $V_{FG(E)}$. This contributes to a reduction in the power consumption of the flash memory as a whole.

Figure 6:
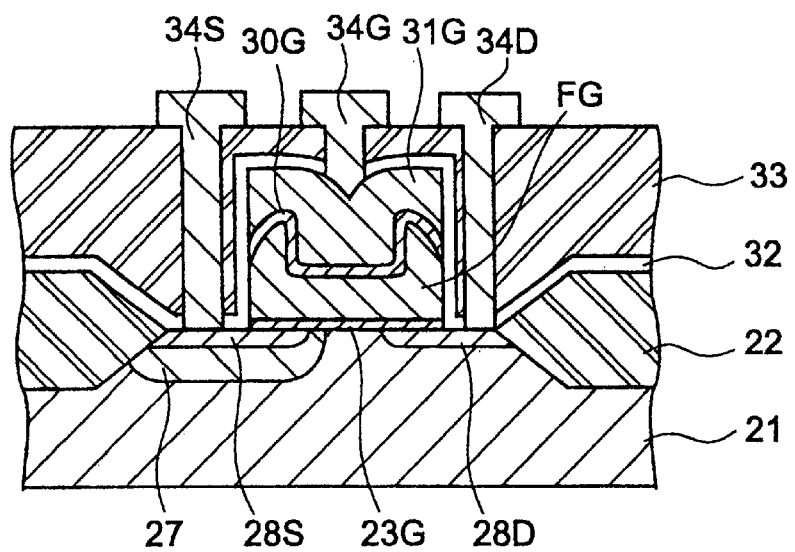
FIG. 6 is a cross-sectional view schematically showing the structure of a memory cell in a flash memory according to a second embodiment of the present invention.

FIG. 6 schematically shows, in cross section, the structure of a memory cell in a flash memory according to the second embodiment of the present invention.

The structural feature of the memory cell according to the second embodiment lies in that the top portions of the polysilicon side-wall portions (portions protruding upward on both end portions of the floating gate. FG) to be formed on the side walls of the polysilicon film that constitutes a portion of the floating gate FG are rounded. Since the other structure is the same as that of the first embodiment (see FIG. 4), the description thereof is omitted.

Figure 7A:
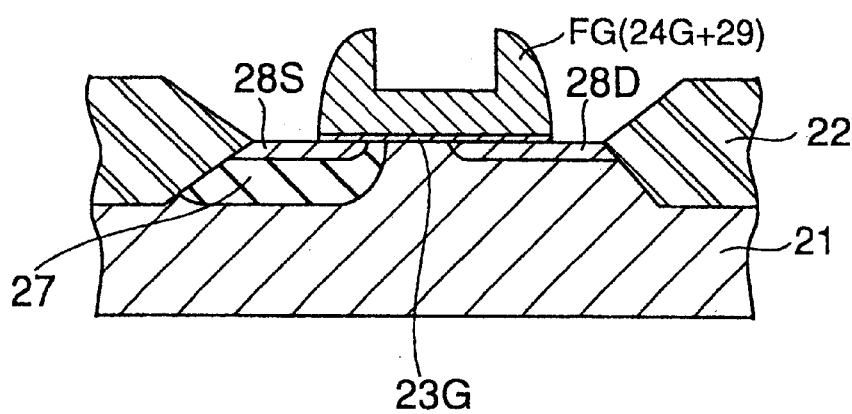
FIGS. 7A to 7C are cross-sectional views illustrating part of a process of producing a memory cell according to the second embodiment.
Figure 7B:
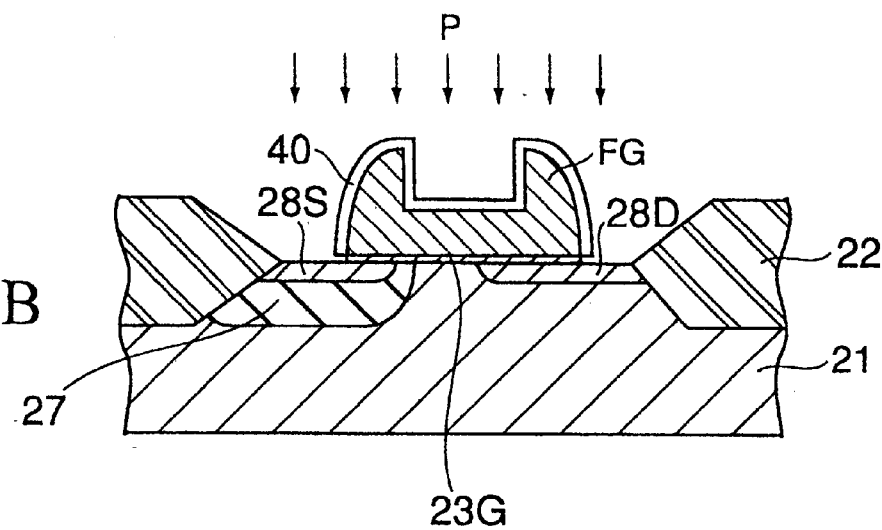
Figure 7C:
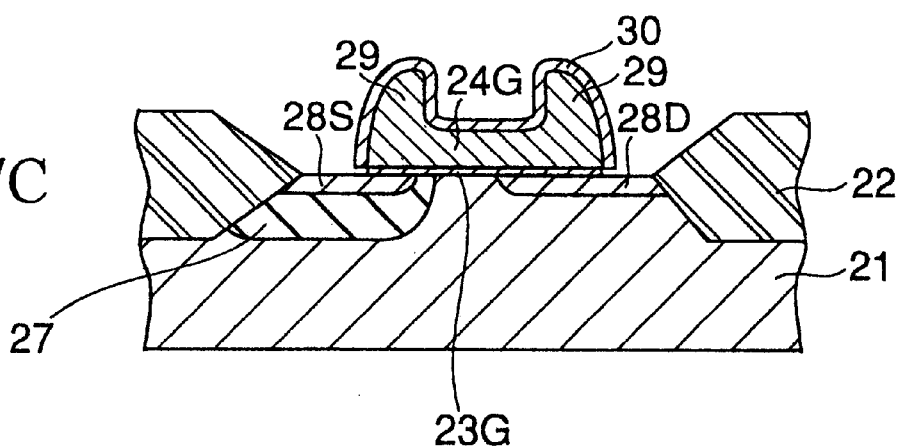

The method of producing a memory cell according to the second embodiment will now be explained with reference to FIGS. 7A to 7C. It should be noted, however, that the method of producing the memory cell according to the second embodiment is substantially the same as that of the first embodiment, except for some steps. To simplify the description, therefore, only the different steps will be described.

At the first step (see FIG. 7A), after the same steps as those illustrated in FIGS. 5A to 5C are performed, the insulation film 25 (see FIG. 5C) is removed by wet etching. At this time, as the top portions of the polysilicon side-wall portions 29 which constitute a portion of the floating gate FG are sharp, an electric field may be concentrated on the sharp portions when the cell is active, which may result in dielectric breakdown.

At the next step (see FIG. 7B), to overcome this shortcoming, a process of rounding the top portions of the polysilicon side-wall portions 29 is implemented. This process can be accomplished by thermally oxidizing the polysilicon side-wall portions 29 together with the polysilicon film 24G at a temperature of, for example, 950° C. or higher (thermal oxide film 40). After the top portions of the polysilicon side-wall portions 29 are rounded, the thermal oxide film 40 is etched out, and phosphorus (P) or the like as an impurity is doped into the polysilicon film 24G and the polysilicon side-wall portions 29. The impurity-doped polysilicon film 24G and polysilicon side-wall portions 29 together constitute the floating gate FG, as per the first embodiment.

Figure 5E:
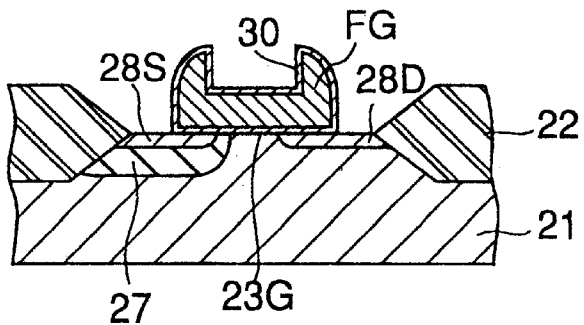
Figure 5F:
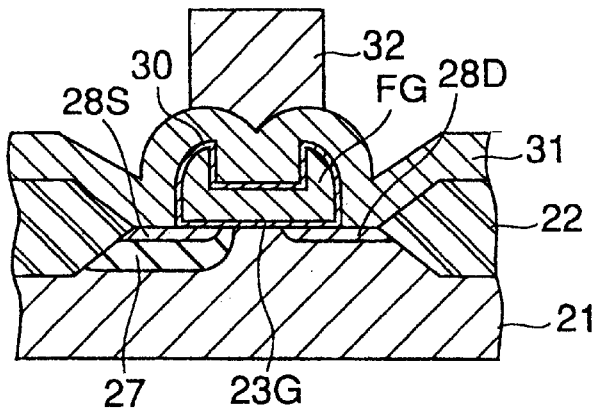
Figure 5G:
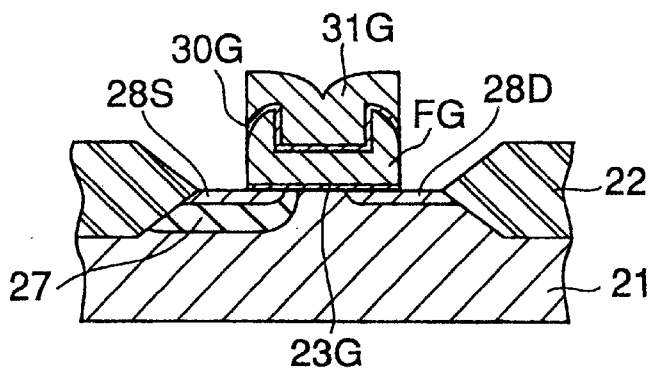
Figure 5H:
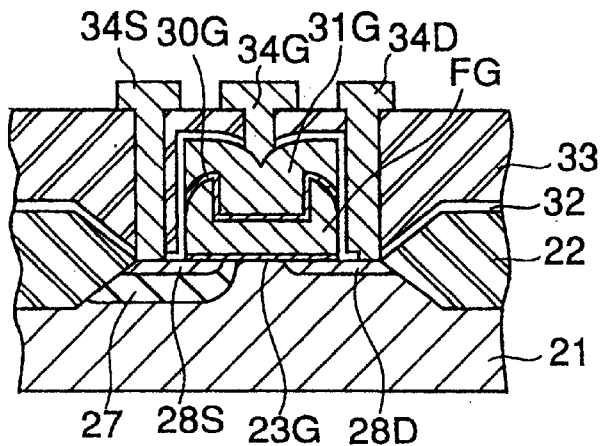

At the next step (see FIG. 7C), the oxide film 30 to be the second gate insulation film 30G is formed about 20 nm thick so as to cover the rounded polysilicon side-wall portions 29 and the polysilicon film 24G by thermal oxidation or CVD at a temperature of, for example, 950° C. or below. The subsequent process will be performed through the same steps as shown in FIGS. 5F to 5H.

Since the sharp portions of the floating gate FG (the top portions of the polysilicon side-wall portions 29) are rounded, the second embodiment has such an advantage as to prevent the electric field from being concentrated on the top portions so that dielectric breakdown can be avoided, in addition to the advantages of the first embodiment.

Figure 8:
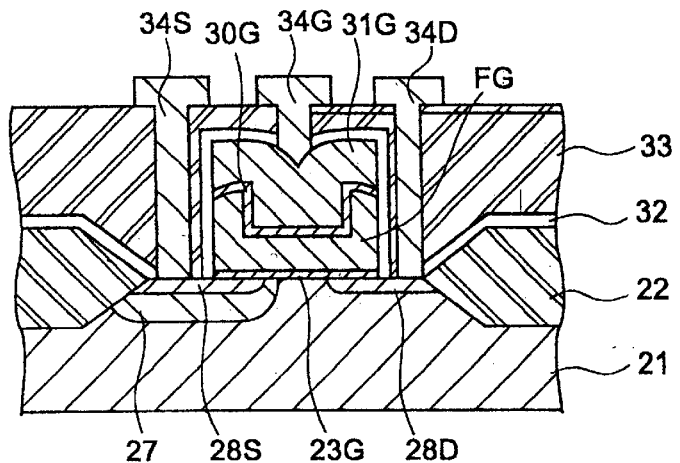
FIG. 8 is a cross-sectional view schematically showing the structure of a memory cell in a flash memory according to a third embodiment of the present invention.

FIG. 8 schematically shows, in cross section, the structure of a memory cell in a flash memory according to the third embodiment of the present invention.

The memory cell according to the third embodiment is almost identical in structure to the memory cell of the first embodiment (see FIG. 4), and its feature lies in that the polysilicon side-wall portions (portions protruding upward on both end portions of the floating gate FG) to be formed on the side walls of the polysilicon film that constitutes a portion of the floating gate FG are made thicker than those in the first embodiment. This difference on the process allows the "sharp" top portions of the polysilicon side-wall portions to be made gentler as shown in FIG. 8, as compared with those in FIG. 4.

Figure 9A:
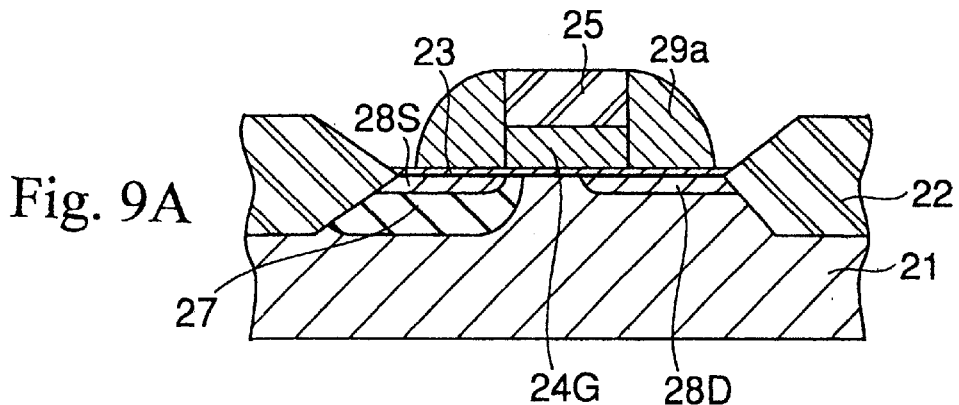
FIGS. 9A to 9C are cross-sectional views illustrating part of a process of producing a memory cell according to the third embodiment.
Figure 9B:
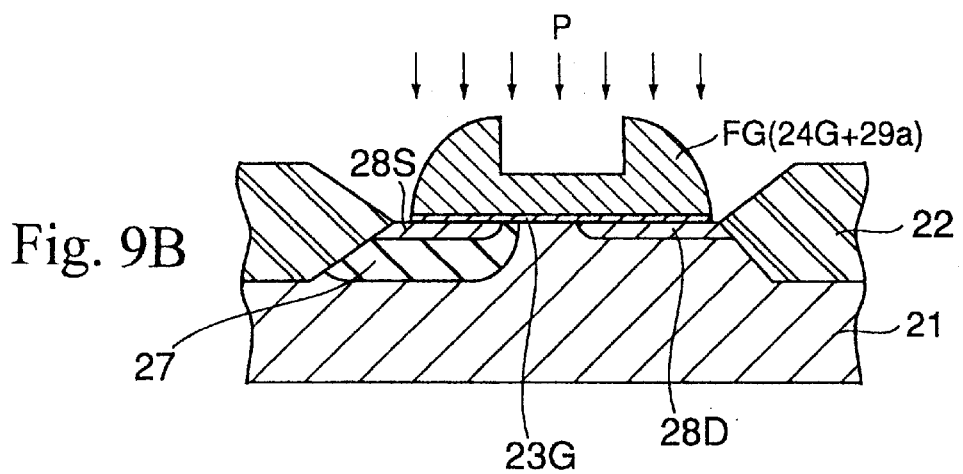
Figure 9C:
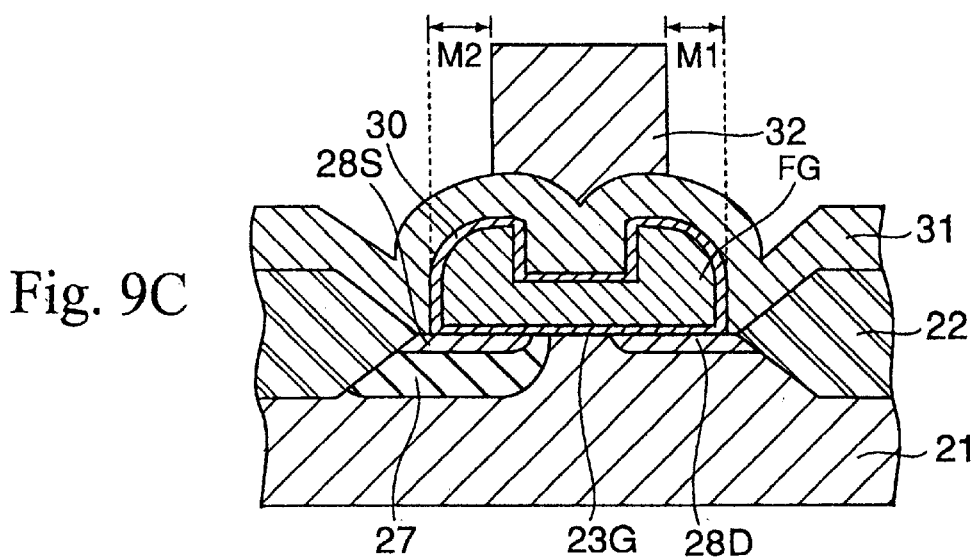

The method of producing a memory cell according to the third embodiment will now be explained with reference to FIGS. 9A to 9C. It should be noted, however, that the method of producing the memory cell according to the third embodiment is substantially the same as that of the first embodiment, except for some steps. For the sake of descriptive simplicity, therefore, only the different steps will be described.

At the first step (see FIG. 9A), after the same steps as those illustrated in FIGS. 5A and 5B are performed, a polysilicon film is formed on the entire surface of the resultant structure thicker (200 nm or greater) than that in the first embodiment (150 nm to 200 mm), and anisotropic dry etching is carried out to form thicker polysilicon side-wall portions 29a on the side walls of the polysilicon film 24G and the insulation film 25.

At the next step (see FIG. 9B), after the insulation film 25 is removed by wet etching, phosphorus (P) or the like as an impurity is doped into the polysilicon film 24G and the polysilicon side-wall portions 29a. The impurity-doped polysilicon film 24G and polysilicon side-wall portions 29a together constitute the floating gate FG, as per the first embodiment.

At the next step (see FIG. 9C), first, the oxide film 30 to be the second gate insulation film 30G is formed about 20 nm thick so as to cover the floating gate FG by thermal oxidation or CVD at a temperature of, for example, 950° C. or below. Then, the polysilicon film 31 to be the control gate 31G is formed about 150 nm thick on the entire surface of the resultant structure, and phosphorus (P) or the like is doped as an impurity in the polysilicon film 31. Further, resist patterning (coating of the resist 32) according to the shape of the resultant floating gate FG is carried out by using photolithography. The subsequent process will be performed through the same steps as shown in FIGS. 5G and 5H.

In addition to the advantages of the first embodiment, the third embodiment has an advantage such that the formation of the thicker polysilicon side-wall portions 29a can secure sufficient margins M1 and M2 (see FIG. 9C) for positioning the floating gate FG with the resist 32 to be used in etching the polysilicon film 31 (control gate) in a later process.

With the sufficient positioning margins secured, even if the position of the mask is deviated slightly, in performing etching along the mask, the four portions, the polysilicon film 31 (the control gate), the oxide film 30 (the second gate insulation film), the polysilicon side-wall portions 29a (the floating gate) and the first gate insulation film 23G, can be etched, so that the proper cell structure with its control gate insulated from the source region 28S and the drain region 28D is formed.

If sufficient margins are not secured (i.e., if the polysilicon side-wall portions are too thin), when the position of the mask is deviated slightly, only the polysilicon film (the control gate) may be etched at the time of carrying out etching along the mask. In this case, the control gate would directly contact the source/drain regions, providing a cell structure which would not work as a memory transistor. The third embodiment is intended to deal with such an inconvenience.

Figure 10:
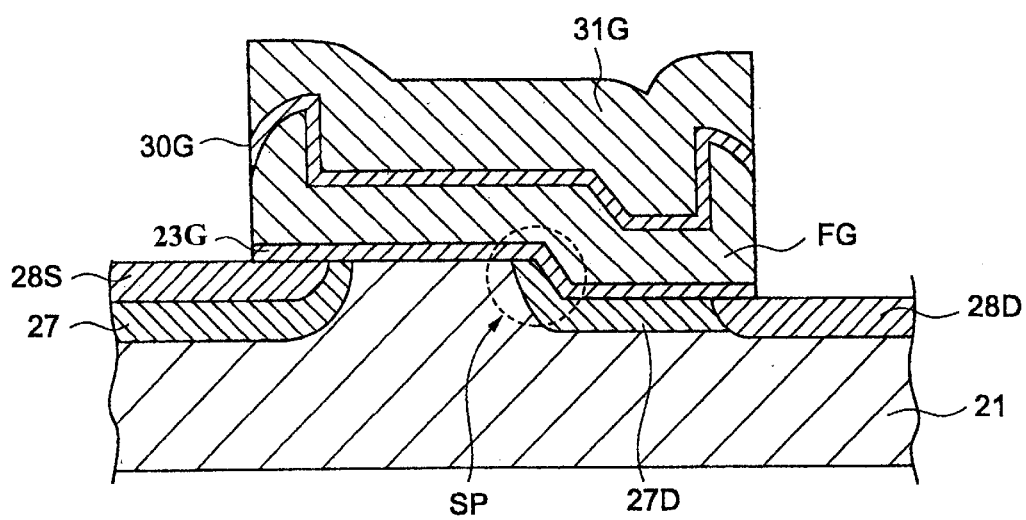
FIG. 10 is a cross-sectional view schematically showing the structure of the essential portion of a memory cell in a flash memory according to a fourth embodiment of the present invention.

Although the foregoing description of the individual embodiments has been given on the assumption that the surface of the semiconductor substrate where memory cells are to be formed is flat, the substrate surface is not limited to this particular shape, but may have a step portion or the like. FIG. 10 exemplifies such a structure.

FIG. 10 schematically shows, in a cross-sectional view, the structure of the essential portion of a memory cell in a flash memory according to the fourth embodiment of the present invention.

The structural feature of the memory cell according to the fourth embodiment lies in that as illustrated, a step portion (encircled by the broken line and indicated by "SP" in the figure) is formed in the gate's lengthwise direction in a region on a semiconductor substrate 21 where the floating gate FG is to be formed. This step portion SP should preferably be formed in the vicinity of the heavily-doped diffusion layer 28D which constitutes the drain region. Reference numeral "27D" denotes a diffusion layer which has a lower impurity concentration than the drain region 28D. This diffusion layer 27D may be replaced with the heavily-doped diffusion layer 28D as an extension of the drain region, in which case, the channel length becomes shorter, increasing a possibility of occurrence of punch-through. In view of this point, therefore, it is desirable that the diffusion layer 27D has a low concentration. Since the other structure is the same as that of the first embodiment (see FIG. 4), the description thereof is omitted.

The method of producing the memory cell according to the fourth embodiment is substantially the same as that of the first embodiment, except for some steps. Only the different steps will be discussed below.

First, after an oxide film as an insulation film for device isolation is formed about 400 nm to 800 nm thick on the semiconductor substrate (p-type silicon substrate) 21 by, for example, thermal oxidation, resist patterning of the semiconductor substrate 21 is (coating of a resist) performed by photolithography in order to form the step portion SP on the drain region side, and the semiconductor substrate 21 is locally etched to a depth of about 50 nm with this resist used as a mask. Then, with the resist still remaining, arsenic (As) or the like as an n-type impurity is lightly doped, thus forming the lightly-doped diffusion layer 27D on the side walls of and at the bottom of the step portion SP. Then, the resist is removed, and then the first gate insulation film 23G is formed about 10 nm thick. Thereafter, the same steps as those of the first embodiment are carried out to complete the intended cell structure of a flash memory according to the fourth embodiment.

The cell structure of the fourth embodiment provides such an advantage that the vertical channel is additionally formed in the conventional horizontal channel, ensuring effective injection of electrons into the floating gate FG from the drain region 28D, in addition to the aforementioned advantages of the first embodiment. This is because when the vertical channel is formed, the gate electric field from the control gate CG generates a horizontal electric field which accelerates the migration of electrons, increasing the amount of electrons to be injected into the floating gate FG. This significantly contributes to an improvement in the write efficiency.

Although the foregoing description of each embodiment-has been given with respect to the case where n-type semiconductor regions (source/drain regions) are formed on a p-type semiconductor substrate, the conductivity types may of course be reversed. In this case, it is apparent to those skilled in the art that the types, concentrations and the like of impurities to be used can be selected properly in accordance with the conductivity types.

What is claimed is:

1. A method of producing a non-volatile semiconductor memory device, the method including a step of forming memory cells each having a duplicate gate structure in which a floating gate and a control gate are stacked, said step of forming memory cells comprising:

a first step of forming a first gate insulation film, a first conductive film and an insulation film in due order on a semiconductor substrate of a first conductivity type;

a second step of forming first and second semiconductor regions of a second conductivity type opposite to said first conductivity type on said semiconductor substrate so as to be self-aligned with side walls of said first conductive film;

a third step of forming conductive side-wall portions on said side walls of said first conductive film and side walls of said insulation film;

a fourth step of removing said insulation film;

a fifth step of doping an impurity into said first conductive film and said conductive side-wall portions to thereby form said floating gate;

a sixth step of forming a second gate insulation film and a second conductive film in due order so as to cover said floating gate;

a seventh step of, after doping an impurity in said second conductive film, forming a mask of a shape matching a shape of a resultant floating gate on said second conductive film; and an eighth step of removing said second conductive film, said second gate insulation film, said conductive side-wall portions and said first gate insulation film along said mask, to thereby form said resultant floating gate and said control gate.

2. The method as set forth in claim 1, further comprising, before said second step, a step of forming a third semiconductor region having a lower impurity concentration than that of said first semiconductor region under the first semiconductor region.

3. The method as set forth in claim 2, further comprising, after said fifth step, a step of rounding top portions of said conductive side-wall portions.

4. The method as set forth in claim 3, wherein said step of rounding top portions of said conductive side-wall portions is carried out by thermally oxidizing said conductive side-wall portions at a predetermined temperature.

5. The method as set forth in claim 4, wherein said predetermined temperature is set to be 950° C. or more.

6. The method as set forth in claim 3, wherein said conductive side-wall portions are formed to have a thickness of 200 nm or more.

7. The method as set forth in claim 2, wherein said conductive side-wall portions are formed to have a thickness ranging from 100 nm to 300 nm.

8. The method as set forth in claim 1, wherein said first conductive film and said conductive side-wall portions are formed by polysilicon films, and said second conductive film is formed by a polysilicon film.

9. The method as set forth in claim 1, wherein said first conductive film and said conductive side-wall portions are formed by polysilicon films, and said second conductive film has a polysilicon film and a metal layer or a metal reaction layer stacked one on the other.

10. The method as set forth in claim 1, wherein said first and second gate insulation films are both formed by oxide films.

11. The method as set forth in claim 1, wherein said first gate insulation film is formed by an oxide film and said second gate insulation film has a structure in which oxide films and nitride films are alternately stacked.

12. The method as set forth in claim 1, further comprising, before said first step, a step of forming a step portion in a gate's lengthwise direction in a region on said semiconductor substrate which corresponds to a portion where said first conductive film is formed.

* * * * *